United States Patent [19]
Voldman

[11] Patent Number: 6,118,155
[45] Date of Patent: Sep. 12, 2000

[54] INTEGRATED ESD STRUCTURES FOR USE IN ESD CIRCUITRY

[75] Inventor: Steven H. Voldman, South Burlington, Vt.

[73] Assignee: Internatioanl Business Machines Corporation, Armonk, N.Y.

[21] Appl. No.: 09/334,078

[22] Filed: Jun. 16, 1999

[51] Int. Cl.$^7$ .......................... H01L 23/62; H01L 27/01; H01L 27/12; H01L 31/0392
[52] U.S. Cl. .......................... 257/360; 257/350; 438/155; 438/237
[58] Field of Search .................................. 257/350, 360, 257/361; 438/155, 237, 279

[56] References Cited

U.S. PATENT DOCUMENTS

| | | | |
|---|---|---|---|
| 5,485,024 | 1/1996 | Reay | 257/173 |
| 5,811,857 | 9/1998 | Assaderaghi et al. | |
| 6,037,636 | 3/2000 | Crippen | 257/355 |

OTHER PUBLICATIONS

S. Voldman et al., "Dynamic threshold body– and gate–coupled SOI ESD protection networks," Journal of Electrostatics 44, pp. 239–255 (1998).

*Primary Examiner*—Ngân V. Ngô

*Attorney, Agent, or Firm*—Dugan & Dugan; Eugene I. Shkurko; Peter W. Peterson

[57] ABSTRACT

Apparatus for use in ESD circuitry are provided that comprise a substrate layer on a dielectric wherein the substrate layer includes a first geometric region comprising alternating regions of first and second conductivity types, a second geometric region of substantially one conductivity type surrounding the first geometric region and a third geometric region of substantially one conductivity type surrounding the second geometric region. The substrate layer further includes at least one dielectric layer on at least the second geometric region and a gate layer on the dielectric layer, over the second geometric region and over at least a portion of the second geometric region that is adjacent the alternating first and second conductivity type regions. In a first aspect of the invention, the alternating first and second conductivity type regions preferably are abutted, and a salicide layer may be employed to coupled together adjacent first and second conductivity type regions if desired. In a second and a third aspect of the invention, the alternating first and second conductivity type regions preferably are separated by shallow trench isolation regions or by polysilicon regions, respectively. The at least one dielectric layer may be thicker in at least one portion of the second geometric region than in another portion of the second geometric region. An ASIC book may be formed from one or more of the apparatus.

27 Claims, 15 Drawing Sheets

INTEGRATED ESD STRUCTURES FOR USE IN ESD CIRCUITRY

FIELD OF THE INVENTION

The present invention relates to electrostatic discharge (ESD) protection circuitry and more specifically to integrated ESD structures for use in ESD circuitry.

BACKGROUND OF THE INVENTION

Metal-oxide-semiconductor field-effect-transistor (MOSFET) scaling continues to be the trend for high-density, high-performance and low-power complementary metal-oxide-semiconductor (CMOS) technology. By employing silicon-on-insulator (SOI) substrates, many concerns and obstacles of low power-supply voltage bulk-silicon CMOS technology can be eliminated (e.g., due to the low power consumption, low leakage current, low capacitance diode structures, etc., of CMOS-on-SOI devices).

Accompanying the growing interest in CMOS-on-SOI is an interest in electrostatic discharge (ESD) protection for CMOS-on-SOI technology. Such interest will peak as the migration from bulk CMOS to CMOS-on-SOI becomes a reality and achieving industry-acceptable ESD results becomes mandatory.

The extension of known ESD circuits from bulk technology to SOI technology has been proposed including SOI-based floating body/grounded gate MOSFET networks, grounded body/grounded gate MOSFET networks, lateral bipolar elements, gated diode structures and the like. Additionally, U.S. Pat. No. 5,811,857, which is hereby incorporated by reference herein in its entirety, discloses a novel body-coupled gated diode for SOI technology that provides superior ESD protection to conventional ESD diodes.

A need nonetheless remains for compact and flexible designs for such SOI-based ESD structures.

SUMMARY OF THE INVENTION

To address the needs of the prior art, inventive ESD structures are provided. Specifically, inventive apparatus are provided that comprise a substrate layer on a dielectric (e.g., a substrate layer of an SOI substrate) wherein the substrate layer includes a first geometric region comprising alternating regions of first and second conductivity types, a second geometric region of substantially one conductivity type surrounding the first geometric region and a third geometric region of substantially one conductivity type surrounding the second geometric region. The substrate layer further includes at least one dielectric layer on at least the second geometric region and a gate layer on the dielectric layer, over the second geometric region and over at least a portion of the second geometric region that is adjacent the alternating first and second conductivity type regions.

In a first aspect of the invention, the alternating first and second conductivity type regions preferably are abutted, and a salicide layer may be employed to coupled together adjacent first and second conductivity type regions if desired. In a second and a third aspect of the invention, the alternating first and second conductivity type regions preferably are separated by shallow trench isolation (STI) regions or by polysilicon regions, respectively. To reduce stress on the at least one dielectric layer, the dielectric layer may be thicker in at least one portion of the second geometric region (e.g., a portion that forms part of a polybound diode) than in another portion of the second geometric region (e.g., a portion that forms part of a metal-oxide-semiconductor field-effect-transistor).

A significant advantage of the inventive apparatus is their compact and flexible design that renders each configuration suitable for numerous ESD applications, and allows the various configurations to be easily combined. For example, an inventive application specific integrated circuit (ASIC) book of gate array cells may be formed from one or more of the inventive apparatus. The various components within the ASIC book then may be interconnected via an interconnection method such as a final metallization step (e.g., a WRIT B) or via another known process or technique according to a user-specified pattern so as to achieve a user-specified function.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1A:
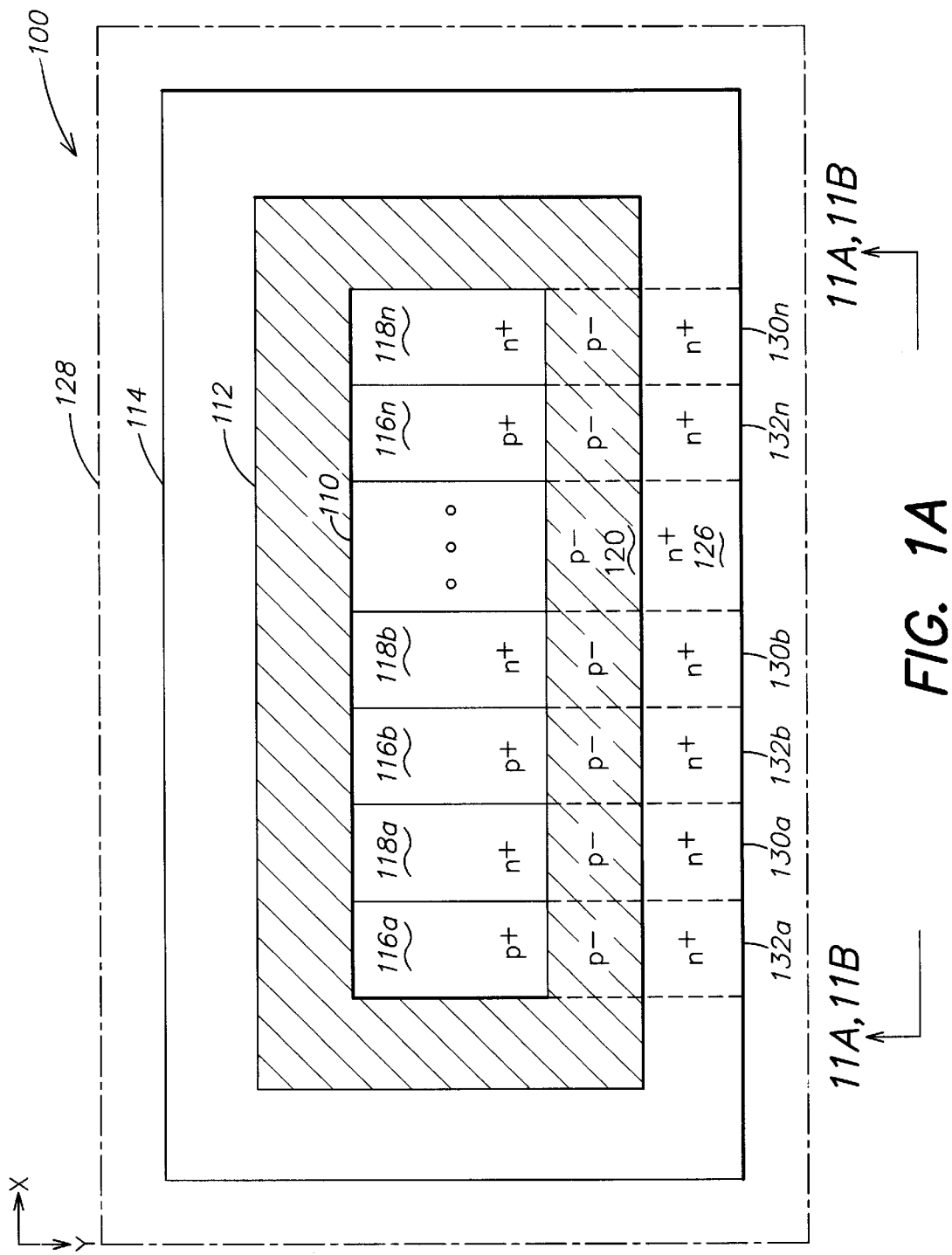
FIGS. 1A and 1B are a top plan view and a perspective view, respectively, of a first SOI ESD structure configured in accordance with the present invention.
Figure 1B:
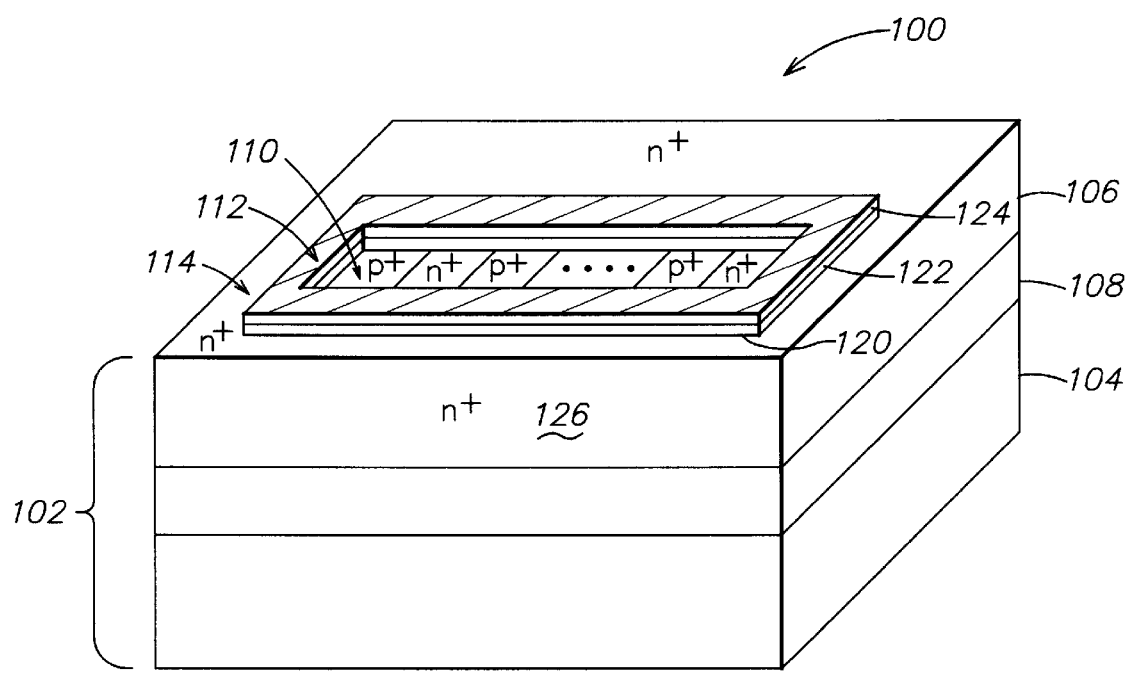

FIGS. 1A and 1B are a top plan view and a perspective view, respectively, of a first SOI ESD structure 100 configured in accordance with the present invention. The first SOI ESD structure 100 is formed from an SOI substrate 102 (e.g., any known SOI substrate, but preferably a silicon SOI substrate formed from a SIMOX, SIBOND or SmartCut/Unibond process) comprising a bulk region 104, a substrate layer 106 and a buried oxide 108 therebetween.

The first SOI ESD structure 100 comprises a first geometric region 110, a second geometric region 112 that surrounds the first geometric region 110 and a third geometric region 114 that surrounds the second geometric region 112. The first geometric region 110 includes alternating abutting regions of first and second conductivity types designated p+ regions 116a–n and n+ regions 118a–n, respectively. Typical doping levels for the p+ regions 116a–n and for the n+ regions 118a–n are both about $10^{20}$ $cm^{-3}$, although other doping levels may be employed. Each of the p+ regions 116a–n and each of the n+ regions 118a–n may have different doping levels if desired.

The second geometric region 112 comprises a region of substantially one conductivity type substrate material (p– region 120) underlying a gate oxide 122 (e.g., silicon dioxide) and a polysilicon gate layer 124. The preferred doping level for the p– region 120 is about $10^{16}$ $cm^{-3}$, although other doping levels may be employed. The gate oxide 122's preferred thickness is about 50 angstroms. Typically the polysilicon layer 124 is highly doped p+ material, doped to a level of about $10^{21}$ $cm^{-3}$. However, to increase the depletion width within the polysilicon layer 124 when a voltage is applied thereto, and thus to reduce voltage stress across the gate oxide 122, the polysilicon layer 124 may be low-doped p– type material, doped to a level of about $10^{17}$ $cm^{-3}$.

The third geometric region 114 also comprises a region of substantially one conductivity type substrate material (n+ region 126 preferably doped to a level of about $10^{20}$ $cm^{-3}$) and preferably is surrounded by a trench or locus isolation region 128 (FIG. 1A). Methods for forming the first SOI ESD structure 100 of FIGS. 1A and 1B, as well as the SOI ESD structures of FIGS. 2–11B, are described below with reference to FIG. 13.

With reference to FIGS. 1A and 1B, the first SOI ESD structure 100 provides a compact and flexible design for ESD circuitry. For example, the n+ regions 118a–n of the first geometric region 110 in combination with the p– region 120 of the second geometric region 112 and the n+ region 126 of the third geometric region 114 form a plurality of n-channel MOSFETS 130a–n, with each MOSFET defined along the y-axis as shown. Each p+ region 116a–n adjacent each MOSFET 130a–n serves as a body contact for the MOSFET (e.g., via a path through the p– region 120) and additionally forms a polysilicon bound ("polybound") diode 132a–n in parallel with the MOSFET 130a–n, as shown.

Because the p+ regions 116a–n and the n+ regions 118a–n are abutted, the body (e.g., one of the p+ regions 116a–n) and the source (e.g., one of the n+ regions 118a–n) of each MOSFETS 130a–n are effectively shorted together. Accordingly, the first SOI ESD structure 100 is well suited for grounded body/grounded source ESD applications as are known in the art. Note that a salicide layer (not shown) may be employed between abutting p+ and n+ regions where necessary to avoid any Zener type issues associated with abutted type structures. Each MOSFET 130a–n may be employed as a body-coupled gated diode by coupling together the MOSFET's body (e.g., one of the p+ regions 116a–n), gate (e.g., the polysilicon layer 124) and drain (e.g., the n+ region 126 of the third geometric region 114).

Figure 2:
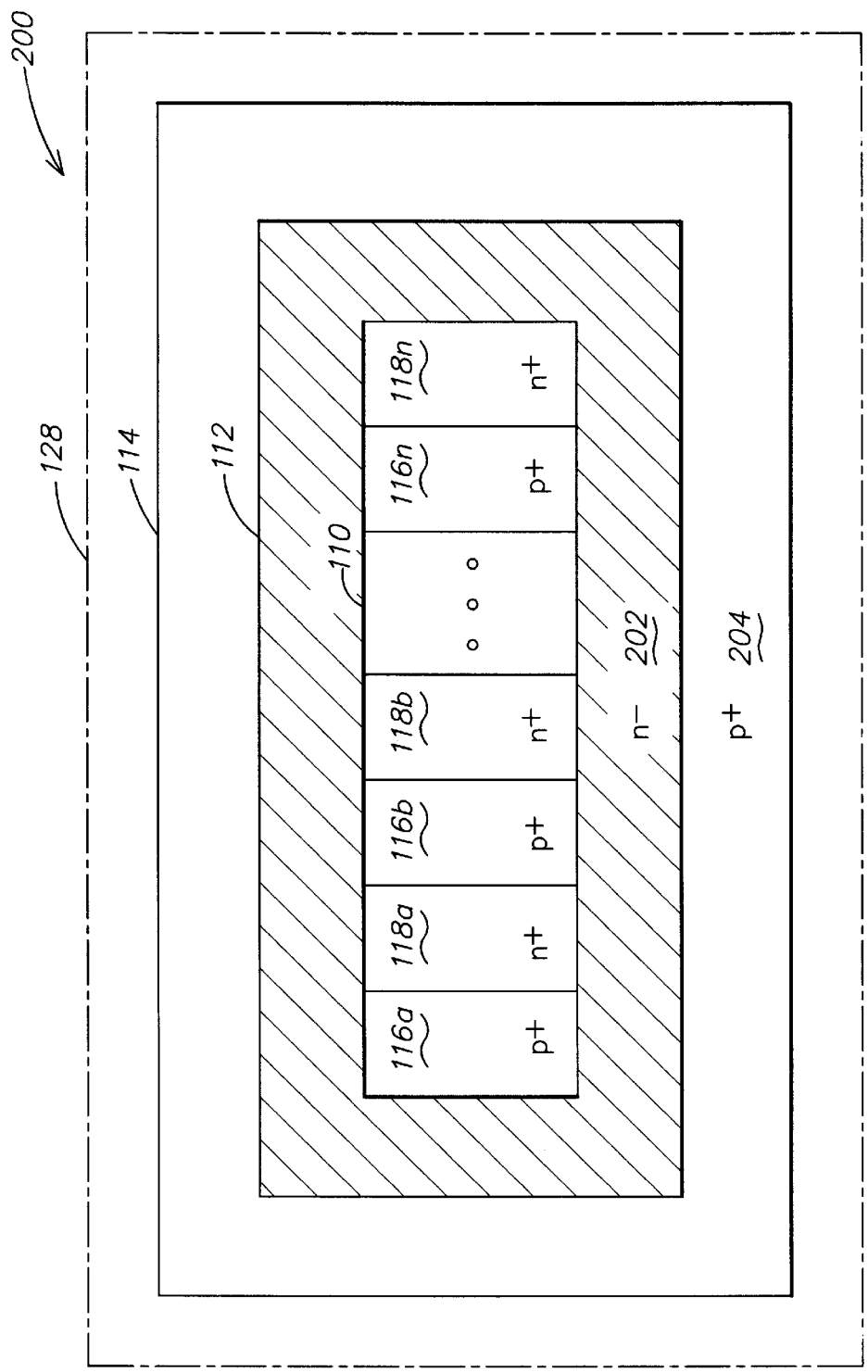
FIG. 2 is a top plan view of a second SOI ESD structure that represents a first alternative embodiment of the first SOI ESD structure of FIGS. 1A and 1B.

FIG. 2 is a top plan view of a second SOI ESD structure 200 that represents a first alternative embodiment of the first SOI ESD structure 100 of FIGS. 1A and 1B. The first SO ESD structure 100 and the second SOI ESD structure 200 are identical with the exceptions that the p– region 120 is replaced with an n– region 202 and the n+ region 126 is replaced with a p+ region 204. The second SOI ESD structure 200 thus may be used to form a plurality of p-channel MOSFETS in parallel with polysilicon bound diodes, as well as body coupled gated diodes. The preferred doping level for the n– region 202 is $10^{17}$ $cm^{-3}$ and for the p+ region 204 is $10^{20}$ $cm^{-3}$, although other doping levels may be employed.

Figure 3:
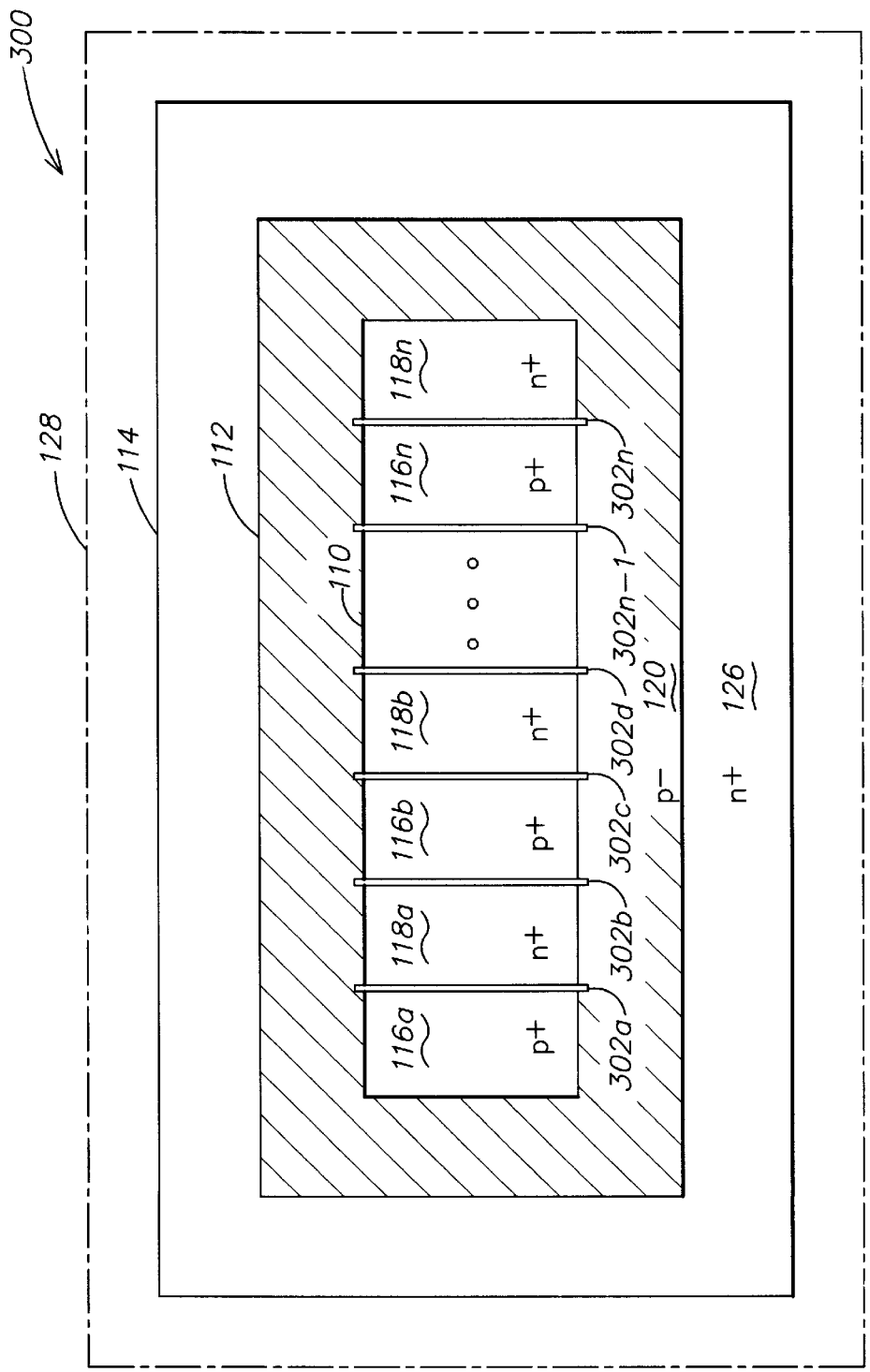
FIG. 3 is a top plan view of a third SOI ESD structure that represents a second alternative embodiment of the first SOI ESD structure of FIGS. 1A and 1B.

FIG. 3 is a top plan view of a third SOI ESD structure 300 that represents a second alternative embodiment of the first SOI ESD structure 100 of FIGS. 1A and 1B. The first SOI ESD structure 100 and the third SOI ESD structure 300 are identical with the exception that the p+ regions 116a–n and the n+ regions 118a–n are separated by shallow trench isolation (STI) regions 302a–n in the third SOI ESD structure 300.

By isolating the p+ regions 116a–n from the n+ regions 118a–n via the STI regions 302a–n, all of the advantages of the first SOI ESD structure 100 are retained with the additional benefit that the body of each MOSFET 130a–n is isolated from the MOSFET's source/drain to allow for independent biasing of the body (e.g., for dynamic threshold MOS applications as are known in the art or for inclusion of level shifter circuitry between a MOSFET's body and source/drain).

Figure 4:
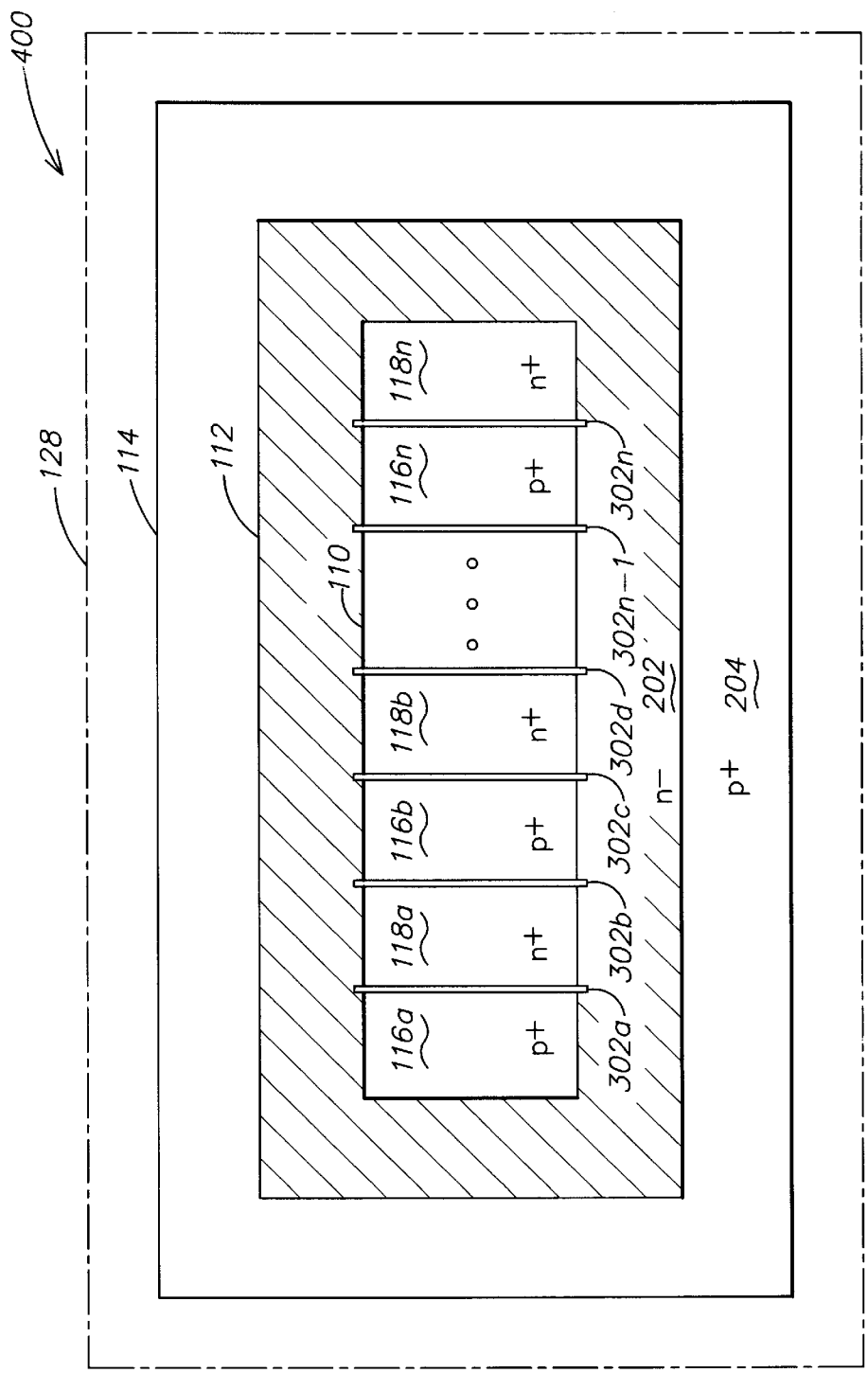
FIG. 4 is a top plan view of a fourth SOI ESD structure that represents an alternative embodiment of the third SOI ESD structure of FIG. 3.

FIG. 4 is a top plan view of a fourth SOI ESD structure 400 that represents an alternative embodiment of the third SOI ESD structure 300 wherein the p– region 120 is replaced with the n– region 202 and the n+ region 126 is replaced with the p+ region 204. The fourth SOI ESD structure 400 thus offers similar benefits to that of the third SOI ESD structure 300 for p-channel MOSFET applications.

Figure 5:
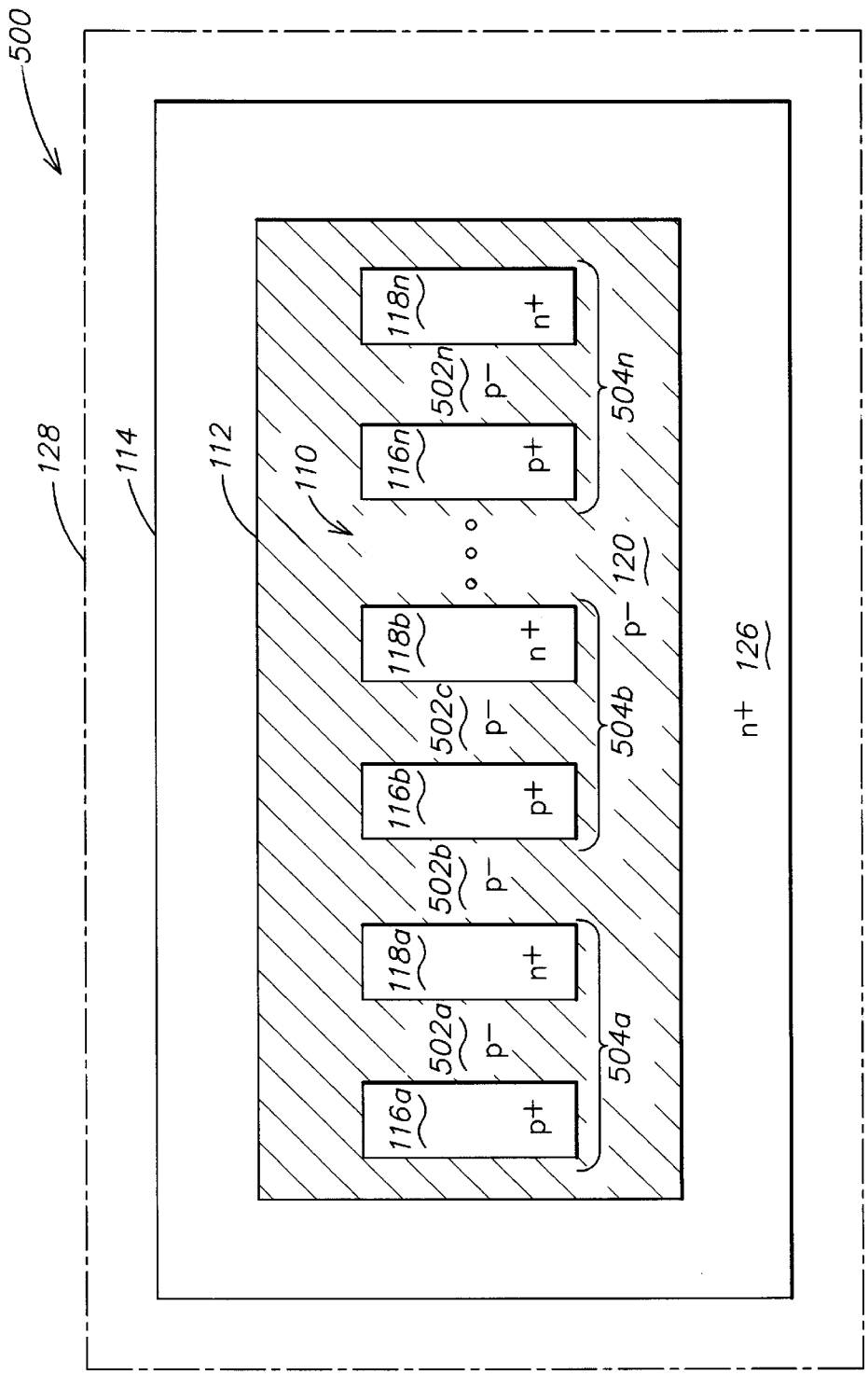
FIG. 5 is a top plan view of a fifth SOI ESD structure that represents a third alternative embodiment of the first SOI ESD structure of FIGS. 1A and 1B.

FIG. 5 is a top plan view of a fifth SOI ESD structure 500 that represents a third alternative embodiment of the first SOI ESD structure 100 of FIGS. 1A and 1B. The first SOI ESD structure 100 and the fifth SOI ESD structure 500 are identical with primarily two exceptions:

(1) the p+ regions 116a–n and the n+ regions 118a–n are separated by a plurality of p– regions 502a–n; and (2) the gate oxide 122 and the polysilicon layer 124 extend from the second geometric region 112 into the first geometric region 100 so as to cover the p– regions 502a–n as shown.

The fifth SOI ESD structure 500 offers similar benefits to the third SOI ESD structure 300 by effectively isolating the p+ regions 116a–n from the n+ regions 118a–n via plurality of polybound diodes 504a–n. However, by thus isolating the p+ regions 116a–n and the n+ regions 118a–n, the fifth SOI ESD structure 500 avoids possible STI pull-down edge effects due to salicide/isolation junction interactions. The fifth SOI ESD structure 500 also avoids STI-bound body contact regions (and any leakage mechanism at the isolation-diffusion interface).

Figure 6:
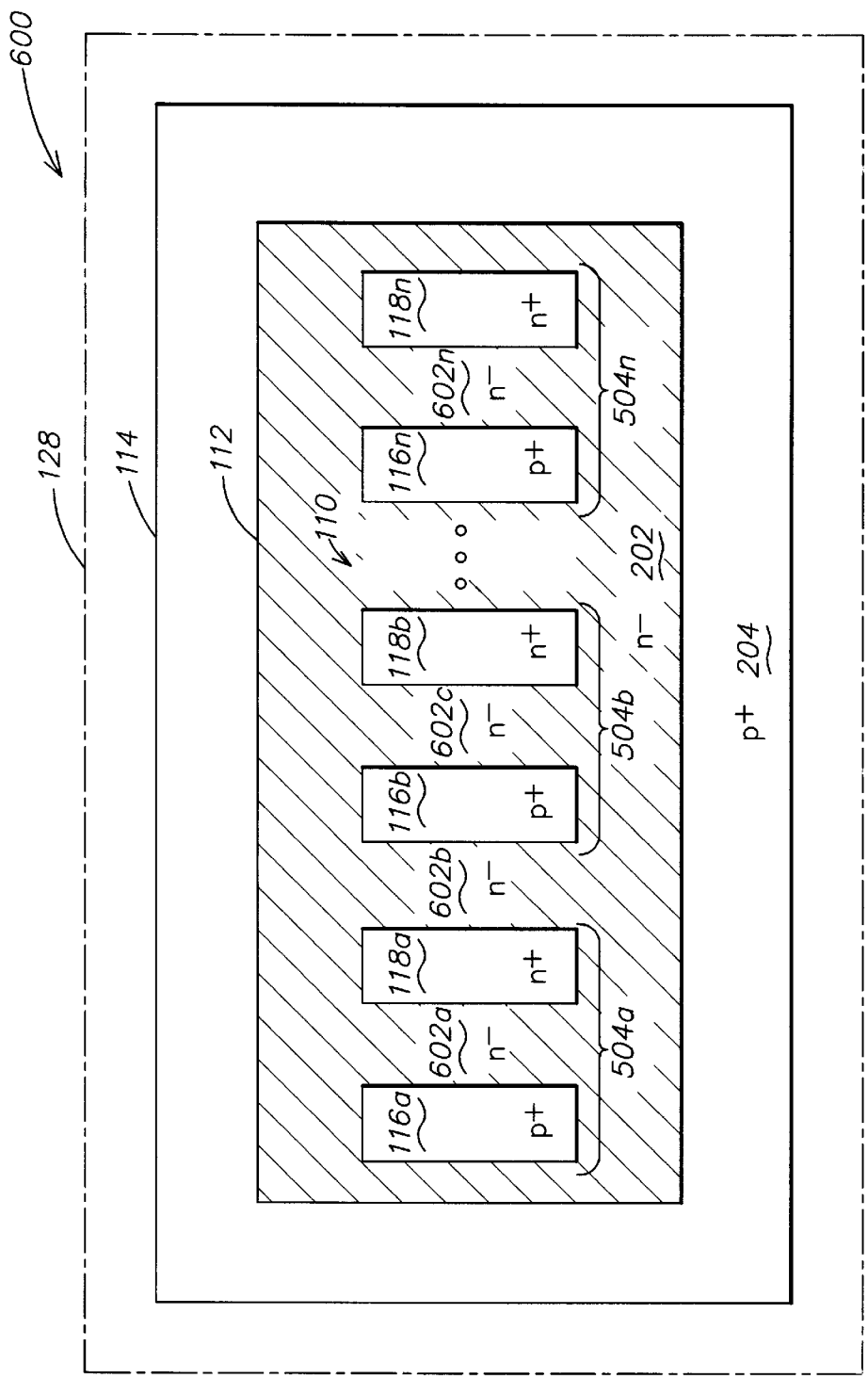
FIG. 6 is a top plan view of a sixth SOI ESD structure that represents an alternative embodiment of the fifth SOI ESD structure of FIG. 5.

FIG. 6 is a top plan view of a sixth SOI ESD structure 600 that represents an alternative embodiment of the fifth SOI ESD structure 500 wherein the p– region 120 is replaced with the n– region 202 and the n+ region 126 is replaced with the p+ region 204, and wherein the p– regions 502a–n are replaced with the n– regions 602a–n. The sixth SOI ESD structure 600 thus offers similar benefits to that of the fifth SOI ESD structure 500 for p-channel MOSFET applications.

Figure 7:
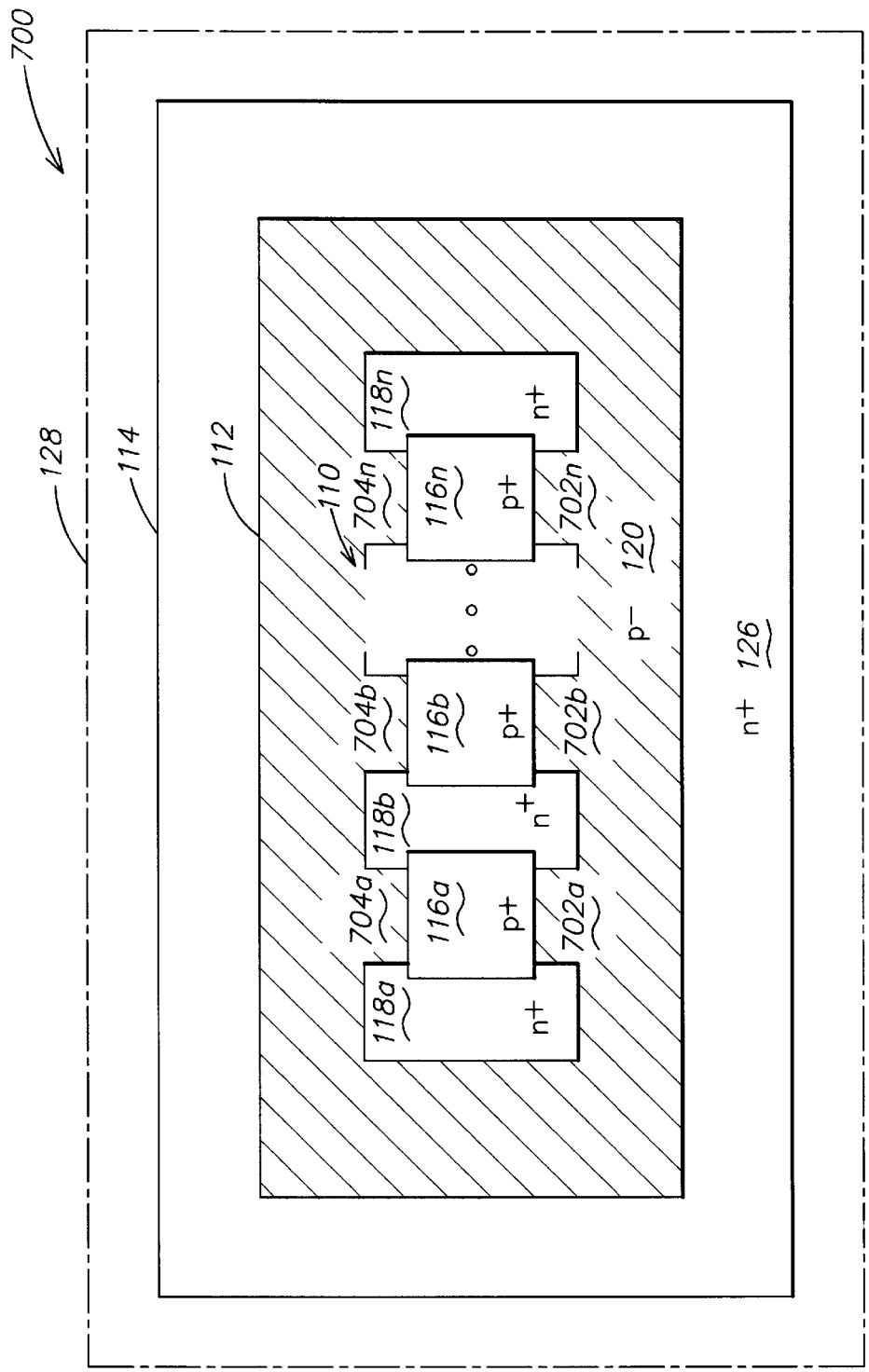
FIG. 7 is a top plan view of a seventh SOI ESD structure that represents a fourth alternative embodiment of the first SOI ESD structure of FIGS. 1A and 1B.

FIG. 7 is a top plan view of a seventh SOI ESD structure 700 that represents a fourth alternative embodiment of the first SOI ESD structure 100 of FIGS. 1A and 1B. The first SOI ESD structure 100 and the seventh SOI ESD structure 700 are identical with primarily three exceptions:

(1) the p+ regions 116a–n and n+ regions 118a–n are interposed;

(2) the p– region 120 extends into the first geometric region 110 to form a first plurality of p– tabs 702a–n and a second plurality of p– tabs 704a–n; and (3) the gate oxide 122 and the polysilicon layer 124 extend into the first geometric region 110 so as to cover the first and second plurality of p– tabs 702a–n, 704a–n, respectively.

The seventh SOI ESD structure 700 offers essentially the same features as the first SOI ESD structure 100.

Figure 8:
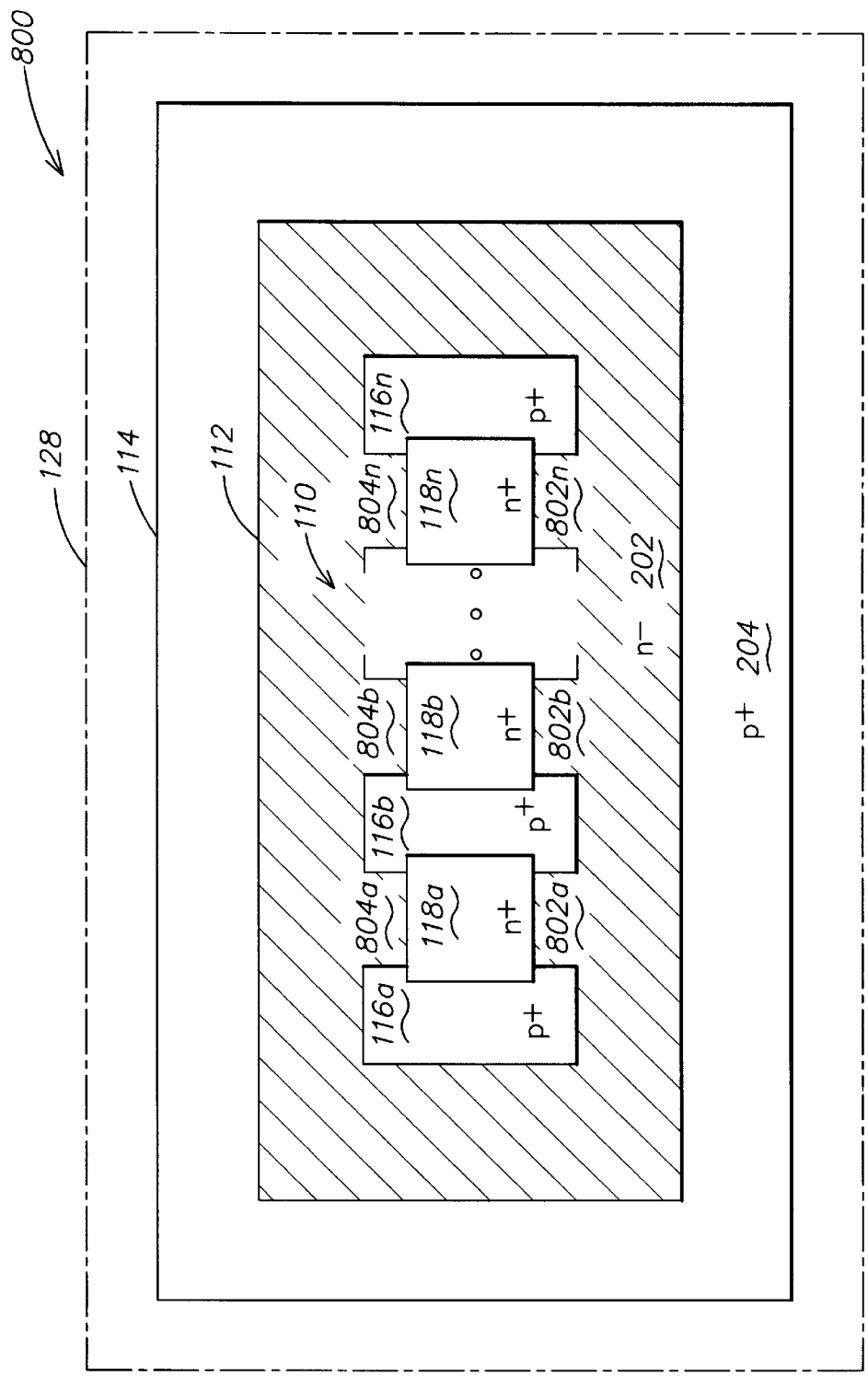
FIG. 8 is a top plan view of an eighth SOI ESD structure that represents a first alternative embodiment of the seventh SOI ESD structure of FIG. 7.

FIG. 8 is a top plan view of an eighth SOI ESD structure 800 that represents a first alternative embodiment of the seventh SOI ESD structure 700 wherein the p+ regions 116a–n and the n+ regions 118a–n are interposed; and wherein the p– region 120 is replaced with the n– region 202 and the n+ region 126 is replaced with the p+ region 204. Note that the n– region 202 extends into the first geometric region 110 to form a first plurality of n– tabs 802a–n and a second plurality of n– tabs 804a–n as shown. The eighth SOI ESD structure 800 offers essentially the same features as the seventh SOI ESD structure 700 but for p-channel MOSFET applications.

Figure 9:
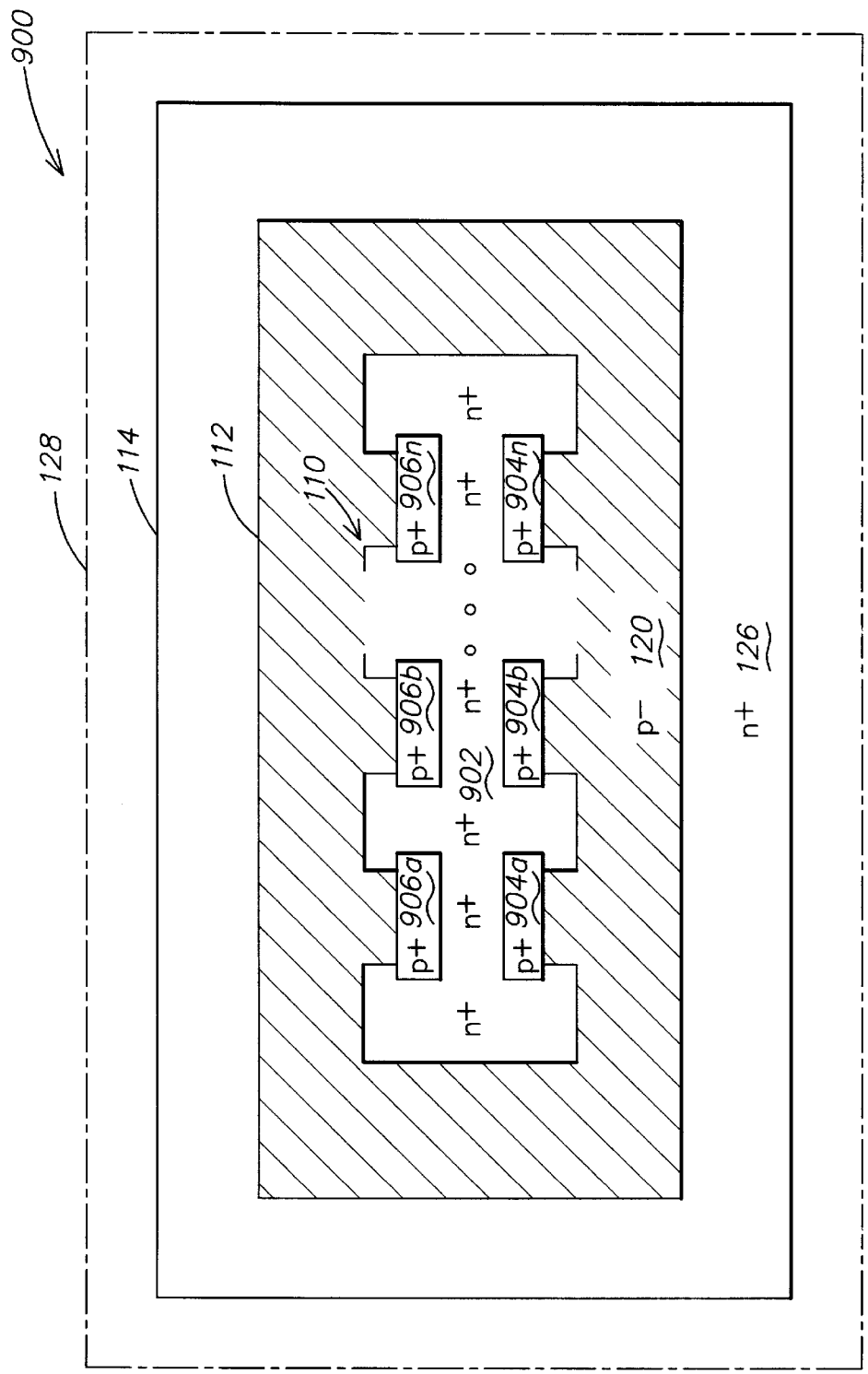
FIG. 9 is a top plan view of a ninth SOI ESD structure that represents a second alternative embodiment of the seventh SOI ESD structure of FIG. 7.
Figure 10:
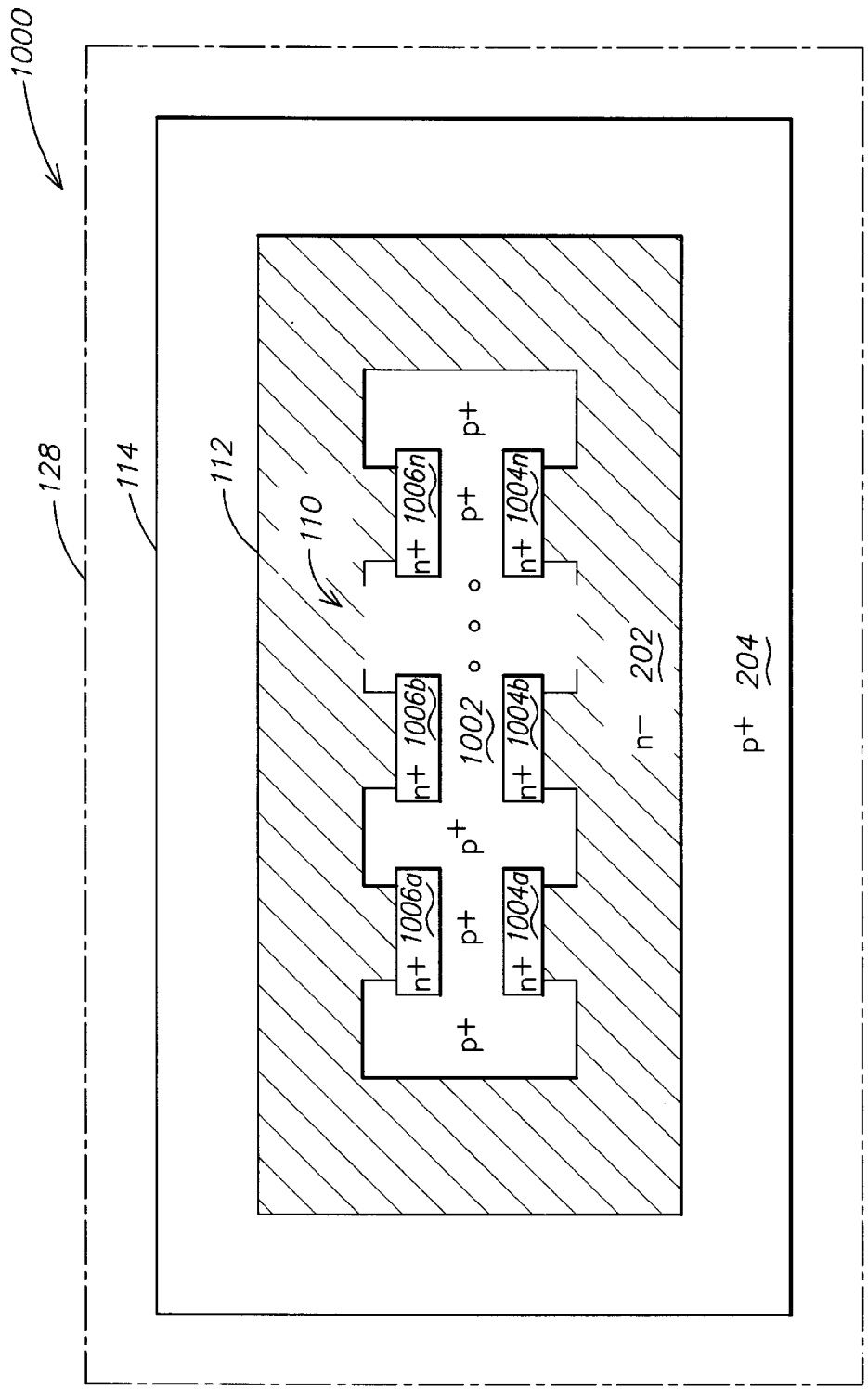
FIG. 10 is a top plan view of a tenth SOI ESD structure that represents a third alternative embodiment of the seventh SOI ESD structure of FIG. 7.

FIG. 9 is a top plan view of a ninth SOI ESD structure 900 that represents a second alternative embodiment of the seventh SOI ESD structure 700 wherein the n+ regions 118a–n extend through and divide the p+ regions 116a–n so as to form a continuous n+ region 902 within the first geometric region 110 and p+ regions 904a–n and 906a–n as shown. Similarly, FIG. 10 is a top plan view of a tenth SOI ESD structure 1000 that represents a third alternative embodiment of the seventh SOI ESD structure 700. The tenth SOI ESD structure 1000 is identical to the eighth SOI ESD structure 800 with the exception that the p+ regions 116a–n extend through and divide the n+ regions 118a–n so as to form a continuous p+ region 1002 and n+ regions 1004a–n and 1006a–n as shown. The ninth SOI ESD structure 900 and tenth SOI ESD structure 1000 offer essentially the same features as the first SOI ESD structure 100 and second SOI ESD structure 200, respectively.

To improve the ESD over voltage limits of the polybound structures within the first SOI ESD structure 100, the second SOI ESD structure 200, the third SOI ESD structure 300, the fourth SOI ESD structure 400, the fifth SOI ESD structure 500, the sixth SOI ESD structure 600, the seventh SOI ESD structure 700, the eighth SOI ESD structure 800, the ninth SOI ESD structure 900 and the tenth SOI ESD structure 1000 (e.g., the polybound diodes 132a–n, the polybound diodes 504a–n, etc.), the oxide thickness underneath the polybound regions may be selectively increased while the gate oxide thickness of each MOSFET is maintained. The oxide thickness underneath each polybound region may be selectively increased by:

(1) performing a first oxidation within the polybound diode regions while blocking oxide formation within the MOSFET gate regions, followed by performing a second blanket oxidation of normal gate oxide thickness within both the polybound diode regions and the MOSFET gate regions; and (2) performing a first blanket oxidation of normal gate oxide thickness within both the polybound diode regions and the MOSFET gate regions, followed by performing a second oxidation within the polybound diode regions while blocking oxide formation within the MOSFET gate regions.

Figure 11A:
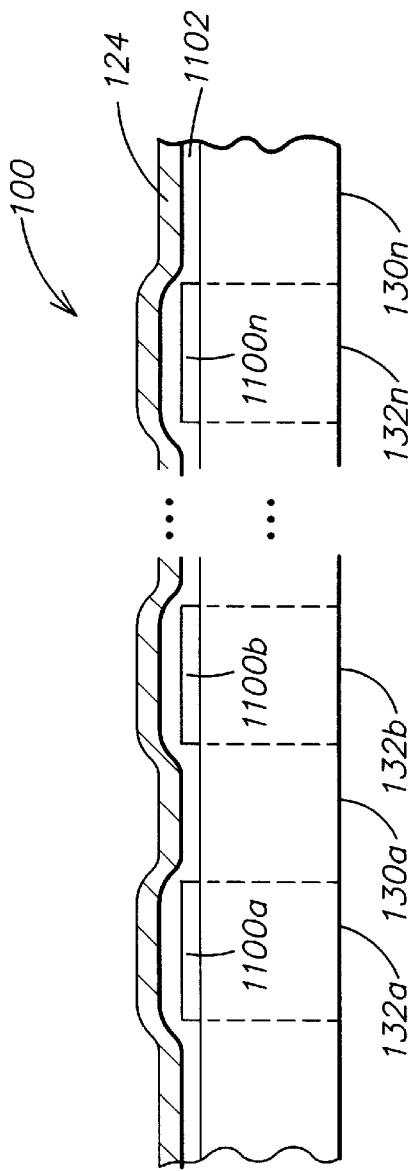
FIG. 11A is a side cross-sectional view of the first SOI ESD structure of FIG. 1A taken along line 11A, 11A that features a dual oxide formed by a first method.

FIG. 11A is a side cross-sectional view of the first SOI ESD structure 100 of FIG. 1A taken along line 11A, 11A that features a dual oxide formed by the first method. With reference to FIG. 11A, a first oxidation is performed only within the regions wherein the polybound diodes 132a–n are to be formed. First oxide regions 1100a–n thereby are formed. Thereafter, a second blanket (gate) oxide layer 1102 is formed over both the regions wherein polybound diodes 132a–n and MOSFETS 130a–n are to be formed. In this manner, an effectively thicker oxide having a large breakdown voltage is generated for each polybound diode 132a–n. Each of the SOI ESD structures 200–1000 may have its polybound diode oxide thicknesses similarly increased.

Figure 11B:
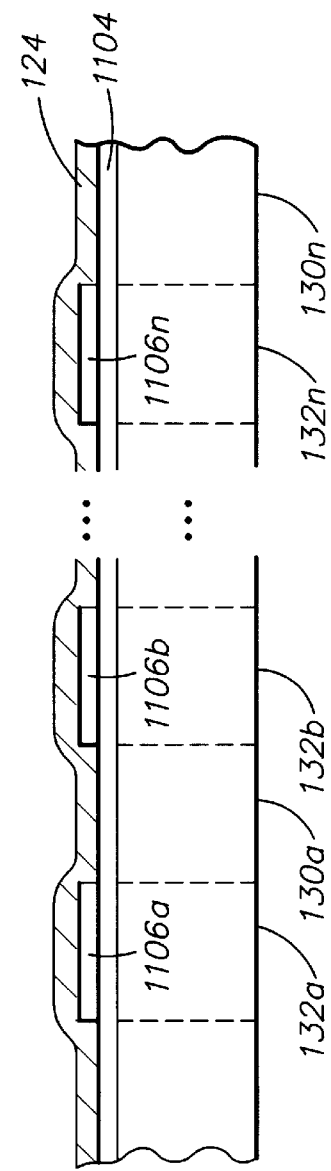
FIG. 11B is a side cross-sectional view of the first SOI ESD structure of FIG. 1A taken along line 11A, 11B that features a dual oxide formed by a second method.

FIG. 11B is a side cross-sectional view of the first SOI ESD structure 100 of FIG. 1A taken along line 11B, 11B that features a dual oxide formed by the second method. With reference to FIG. 11B, a first blanket (gate) oxide layer 1104 is formed within both regions wherein the polybound diodes 132a–n and the MOSFETS 130a–n are to be formed. Thereafter, a second oxidation is performed only within the regions wherein the polybound diodes 132a–n are to be formed. Second oxide regions 1106a–n thereby are formed. In this manner, an effectively thicker oxide having a large breakdown voltage is generated for each polybound diode 132a–n. Again, each of the SOI ESD structures 200–1000 may have its polybound diode oxide thicknesses similarly increased.

Figure 12A:
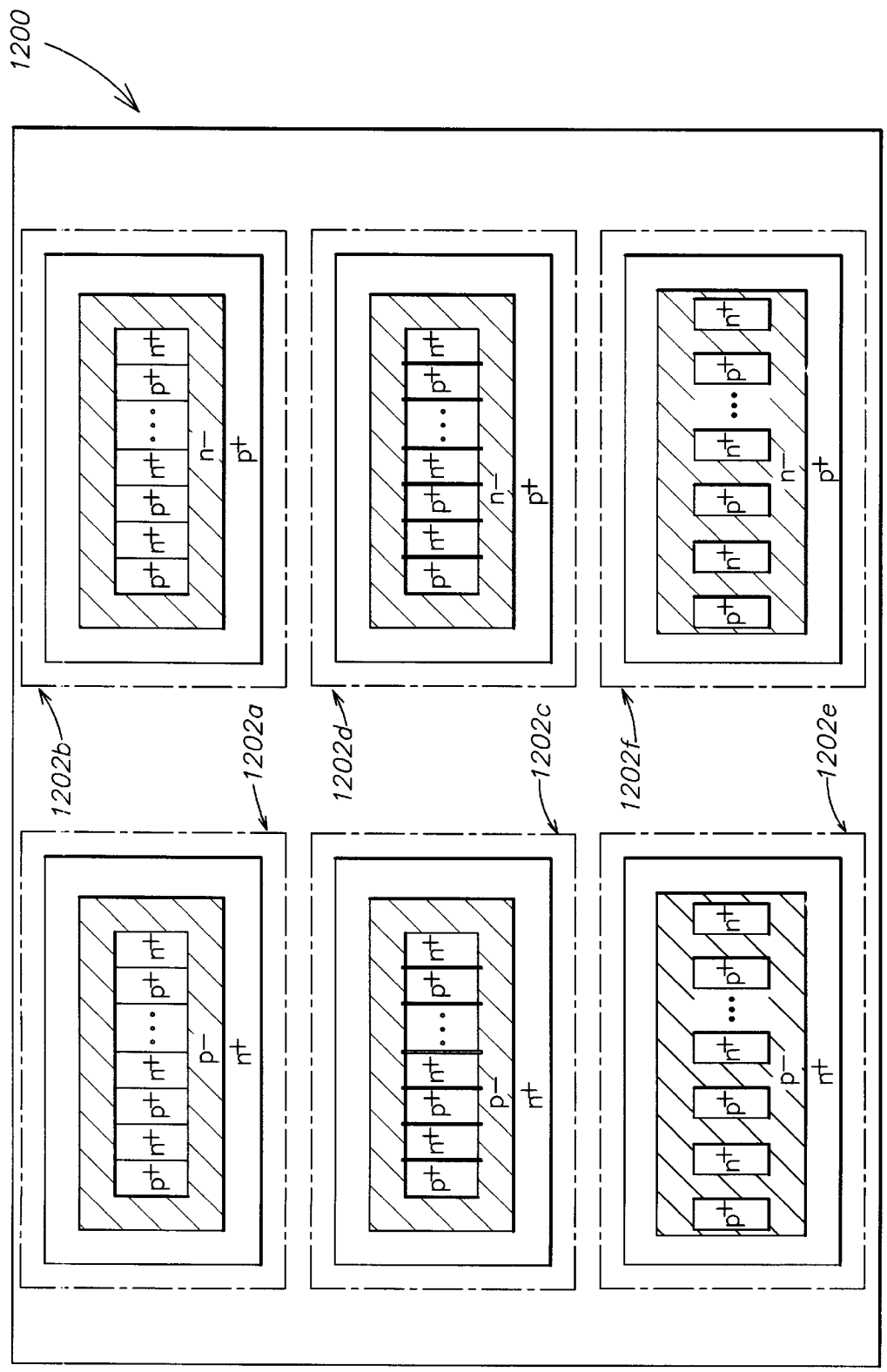
FIG. 12A is a schematic diagram of an inventive ASIC book of gate array cells comprising one or more of the SOI ESD structures of FIGS. 1A–11B.

A significant advantage of the SOI ESD structures 100–1000 is their compact and flexible design that renders each configuration suitable for numerous ESD applications, and allows the various configurations to be easily combined. For example, FIG. 12A is a schematic diagram of an inventive application specific integrated circuit (ASIC) book 1200 of gate array cells 1202a–f comprising one or more of the SOI ESD structures 100–1000. Within the ASIC book 1200, each gate array cell is "unconnected" to other array cells in typical gate-array format so as to form an SOI ESD repository of user-selectable components. The various components within the SOI ESD repository may be interconnected via an interconnection method such as a final metallization step (e.g., a WRIT B) or via another known process or technique according to a user-specified pattern so as to achieve a user-specified function.

By employing the ASIC book 1200, SOI ESD networks can be customized and optimized for each user's specific circuit implementation. For example, the inventive ASIC book 1200 may be used to form any known ESD circuitry such as SOI based floating body/grounded gate MOSFET networks, grounded body/grounded gate MOSFET networks, lateral bi-polar elements, gated diode structures, body-coupled gate diode structures, voltage clamps, multiple power rail ESD networks such as are described in commonly assigned U.S. patent application Ser. No. 09/224,766, filed Jan. 4, 1999, which is hereby incorporated by reference herein in its entirety, and the like.

Figure 12B:
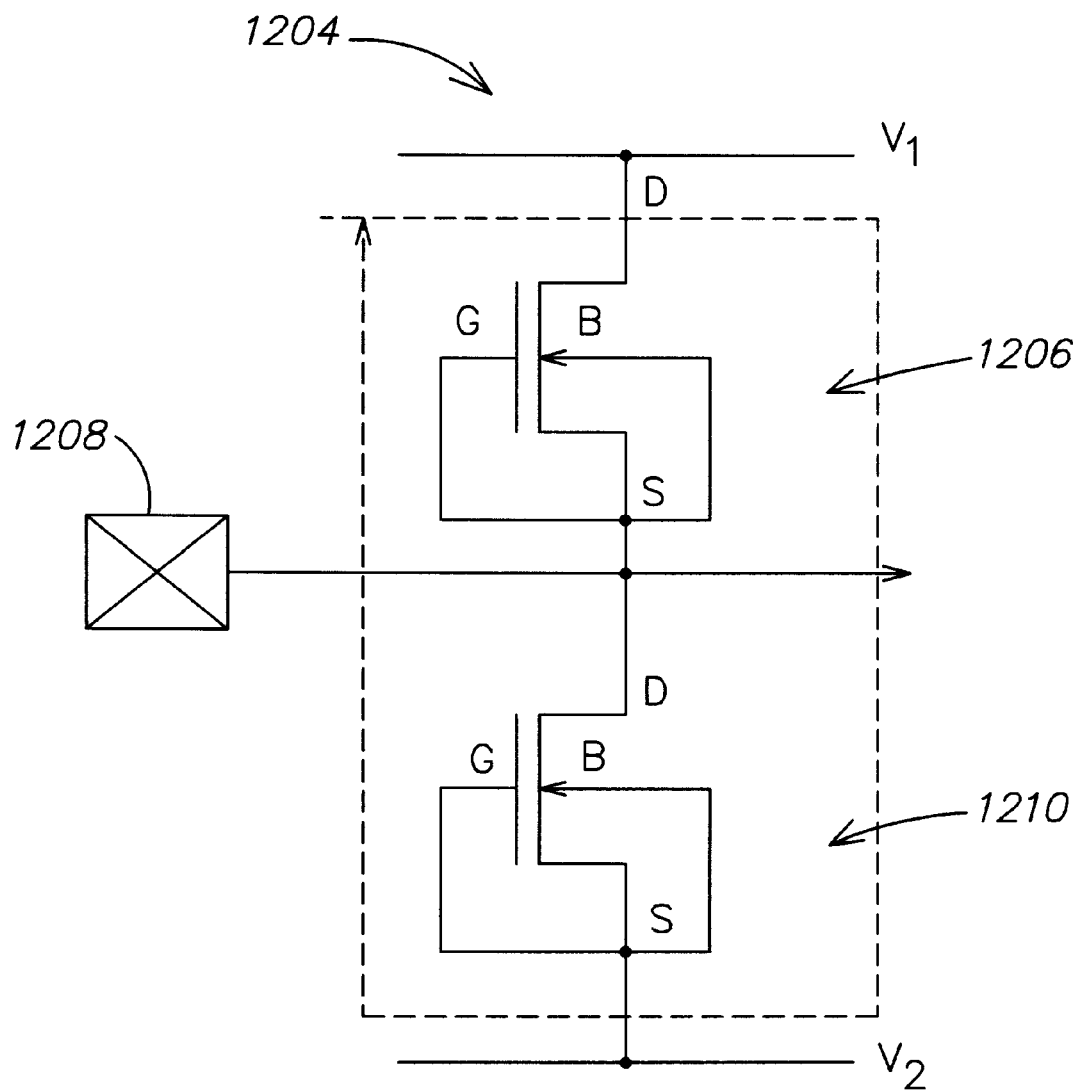
FIG. 12B is a schematic diagram of exemplary ESD protection circuitry formed from one or more of the SOI ESD structures of FIGS. 1A–11B or from the ASIC book of FIG. 12A.

FIG. 12B is a schematic diagram of exemplary ESD protection circuitry 1204 formed from one or more of the SOI ESD structures 100, 300, 500, 700 or 900 of FIGS. 1A–11B or from the ASIC book 1200 of FIG. 12A. The ESD protection circuitry 1204 comprises a first diode 1206 coupled between a first voltage rail ($V_1$) (e.g., a high voltage rail) and a signal pad 1208, and a second diode 1210 coupled between the signal pad 1208 and a second voltage rail ($V_2$) (e.g., a low voltage rail). The first diode 1206 is a body and gate coupled dynamic threshold MOS (DTMOS) diode formed from an n-channel transistor having a drain coupled to the first voltage rail ($V_1$) and a gate, body and source coupled to the signal pad 1208. The second diode 1210 similarly is a body and gate coupled DTMOS diode formed from an n-channel transistor having a drain coupled to the signal pad 1208 and a gate, body and source coupled to the second voltage rail ($V_2$). The first and second diodes 1206, 1210 preferably are formed from one or more of the SOI ESD structures 100, 300, 500, 700 or 900 of FIGS. 1A–11B or from the ASIC book 1200 of FIG. 12A.

In operation, when the voltage on the signal pad 1208 rises above the voltage $V_1$ during an ESD event, the first diode 1206 clamps the signal pad 1208's voltage and sinks excess current from the signal pad 1208 to the first voltage rail ($V_1$) in accordance with DTMOS principles. DTMOS devices and their operation are described in previously incorporated U.S. Pat. No. 5,811,857. When the voltage on the signal pad 1208 falls below the voltage $V_2$ during an ESD event, the second diode 1210 similarly clamps the signal pad 1208's voltage and sinks excess current from the second voltage rail ($V_2$) to the signal pad 1208.

The SOI ESD structures 100–1000 of FIGS. 1A–11B and the ASIC book 1200 of FIG. 12A may be formed by any known fabrication techniques. However, a typical process flow is described below with reference to FIG. 13.

Figure 13:
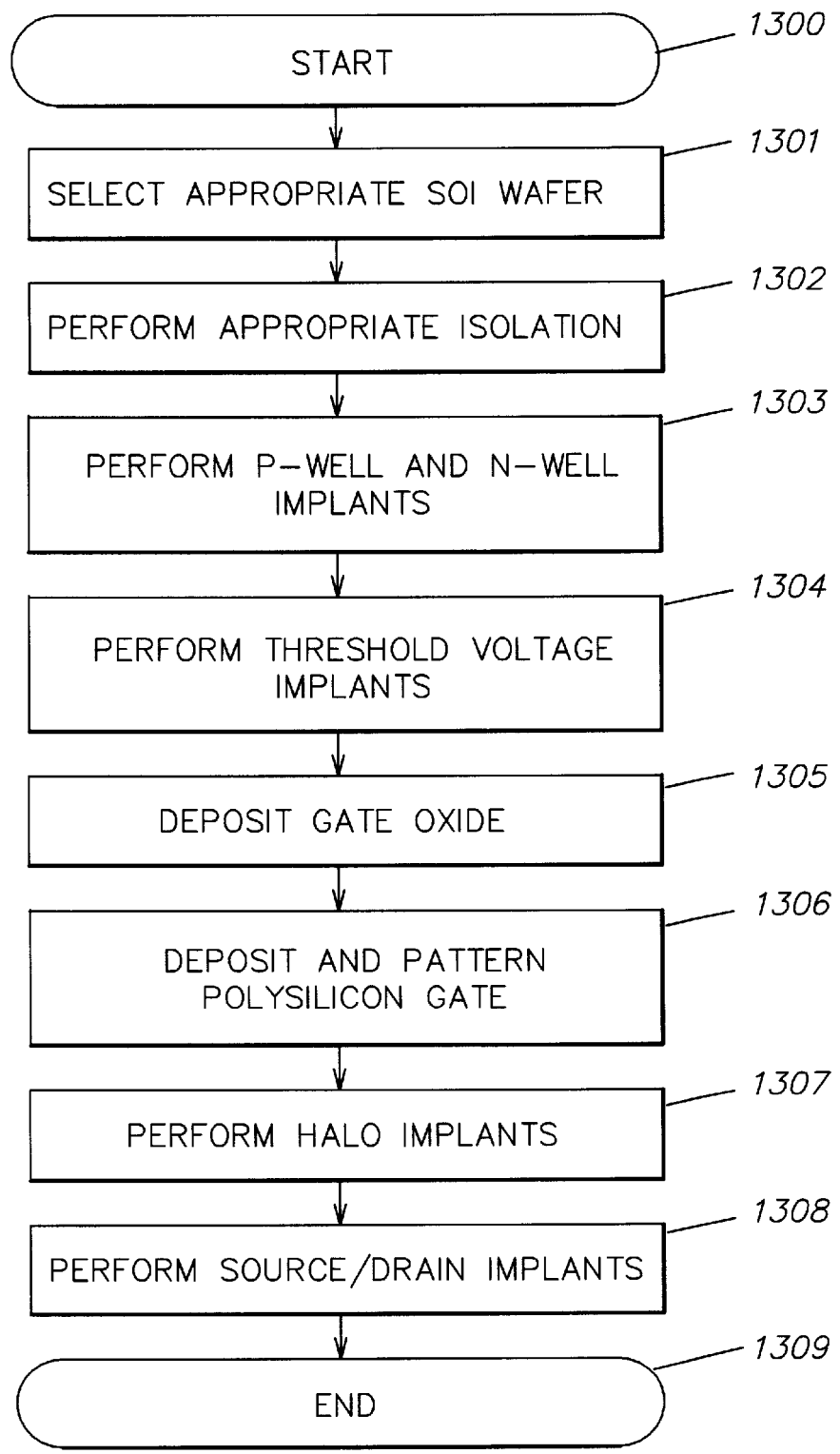
FIG. 13 is a flowchart of a process for forming the SOI ESD structures of FIGS. 1A–11B and/or the ASIC book of FIG. 12A.

FIG. 13 is a flowchart of a process for forming the SOI ESD structures 100–1000 and/or the ASIC book 1200. With reference to FIG. 13, in step 1300 the process starts, and in step 1301 an appropriate SOI wafer is selected such as a SIMOX wafer, an SIBOND wafer, a SmartCut or Unibond wafer or any other suitable SOI wafer. Thereafter, in step 1302, trench isolation or locos regions are formed such as the isolation region 128 and the STI regions 302*a–n*.

In step 1303, p-well and n-well implants are performed so as to form the p– region 120 or the n– region 202. Diffused implants or retrograde keV or MeV ion implants typically are employed. In step 1304, threshold voltage implants are performed to adjust the threshold voltage of the MOSFETs employed (e.g., the MOSFETS 130*a–n*).

In step 1305, the gate oxide 122 is deposited. If a thicker oxide is desired underneath polybound regions, a dual oxide layer may be deposited underneath the polybound regions as previously described with reference to FIGS. 11A and 11B.

In step 1306, the polysilicon layer 124 is deposited and is defined by appropriate masking. Thereafter, in step 1307, halo implants for punch through control (e.g., to improve the robustness of ESD devices by increasing intrinsic carrier contributions) are performed if desired.

In step 1308, source/drain implants for the p+ regions 116*a–n*, the n+ regions 118*a–n*, the n+ region 126 and/or the p+ region 204 are performed to complete n-channel and p-channel MOSFET formation. During this step, a block mask may be employed over the gate as implantation is necessary on both sides of the gate. Further, abrupt junctions may be formed by employing a spacer on a sidewall of the gate and by using a single implant step; or a low doped drain process may be employed wherein a first implant is performed which is self aligned to the gate, wherein a spacer then is formed on a sidewall of the gate and wherein a second source/drain implant thereafter is performed. Alternatively, a first spacer may be formed, followed by a first implant, and a second spacer may be formed, followed by a second implant.

The p and n implants may be performed in any order through appropriate implant blocking. Extension implant structures also may be employed wherein a first, 60 angstrom spacer is formed adjacent n-channels devices, followed by an n+ region implant, wherein a second, 100 angstrom spacer is formed adjacent p-channel devices, followed by a p+ region implant, and wherein a third spacer comprising a thick nitride film (e.g., 300 angstroms) is formed on both n and p channel devices followed by heavy p+ and n+ source/drain implants. Different spacer thicknesses on the p-diffusion side and the n-diffusion side may be employed (e.g., across the gate and between alternating polysilicon separated regions).

In step 1309, the formation process ends.

The foregoing description discloses only the preferred embodiments of the invention, modifications of the above disclosed apparatus and method which fall within the scope of the invention will be readily apparent to those of ordinary skill in the art. For example, when the p+ regions 116*a–n* and the n+ regions 118*a–n* are abutting, local interconnects or other standard contacts may be employed to improve body/source coupling in addition to salicides. Further, anode, cathode and body regions may be selectively salicided to prevent direct shorting of the p+ and n+ alternating regions. The polysilicon layer 124 of any of the SOI ESD structures 100–1000 may comprise a low-doped material to reduce voltage stress across the gate oxide 122.

Accordingly, while the present invention has been disclosed in connection with the preferred embodiments thereof, it should be understood that other embodiments may fall within the spirit and scope of the invention, as defined by the following claims.

The invention claimed is:

1. Apparatus comprising:
   a) a substrate layer on a dielectric;
   b) the substrate layer including:
      i) a first geometric region comprising alternating regions of first and second conductivity types;
      ii) a second geometric region of substantially one conductivity type surrounding the first geometric region;
      iii) a third geometric region of substantially one conductivity type surrounding the second geometric region;
      iv) at least one dielectric layer on at least the second geometric region; and
      v) a gate layer on the dielectric layer, over the second geometric region and over at least a portion of the second geometric region that is adjacent the alternating first and second conductivity type regions.

2. Apparatus of claim 1 wherein the dielectric layer is a buried oxide.

3. Apparatus of claim 1 wherein the alternating first and second conductivity type regions are abutted.

4. Apparatus of claim 3 further comprising a salicide layer coupled to at least one first conductivity type region and to at least one second conductivity type region.

5. Apparatus of claim 1 wherein the alternating first and second conductivity type regions are separated by STI regions.

6. Apparatus of claim 1 wherein the alternating first and second conductivity type regions are separated by polysilicon regions.

7. Apparatus of claim 1 wherein the first geometric region comprises:
- a first portion having alternating regions of first and second conductivity types; and
- a second portion comprising substantially one conductivity type.

8. Apparatus of claim 1 wherein the first conductivity type of the alternating regions comprises a p+ conductivity type and wherein the second conductivity type of the alternating regions comprises an n+ conductivity type.

9. Apparatus of claim 1 wherein the substantially one conductivity type of the second geometric region comprises a conductivity type selected from the group consisting of an n− conductivity type and a p− conductivity type.

10. Apparatus of claim 1 wherein the substantially one conductivity type of the third geometric region comprises a conductivity type selected from the group consisting of an n+ conductivity type and a p+ conductivity type.

11. Apparatus of claim 1 wherein the at least one dielectric layer on at least the second geometric region comprises silicon dioxide.

12. Apparatus of claim 1 wherein the at least one dielectric layer on at least the second geometric region is thicker in at least one portion of the second geometric region than in another portion of the second geometric region.

13. Apparatus of claim 1 wherein the at least one dielectric layer comprises:
- a first dielectric layer on at least the second geometric region; and
- a second dielectric layer on at least one portion of the first dielectric layer that forms part of a polybound diode.

14. Apparatus of claim 1 wherein the at least one dielectric layer comprises:
- a first dielectric layer on at least one portion of the substrate layer that forms part of a polybound diode; and
- a second dielectric layer on the first dielectric layer and at least the second geometric region.

15. Apparatus of claim 1 wherein the gate layer comprises polysilicon.

16. Apparatus of claim 15 wherein the polysilicon gate layer comprises low-doped polysilicon.

17. Apparatus of claim 16 wherein the low-doped polysilicon gate layer comprises polysilicon having a doping density below about $10^{17}$ cm$^{-3}$.

18. An ASIC book comprising a plurality of the apparatus of claim 1 wherein the apparatus are configured for interconnection via an interconnection method based on user selection so as to form an ESD network.

19. An ESD protection device comprising a DTMOS device formed from the apparatus of claim 1.

20. A method of providing an ESD structure comprising:

providing a substrate layer on a dielectric;

forming within the substrate layer:
- a) a first geometric region comprising alternating regions of first and second conductivity types;
- b) a second geometric region of substantially one conductivity type surrounding the first geometric region; and
- c) a third geometric region of substantially one conductivity type surrounding the second geometric region;

depositing at least one dielectric layer on at least the second geometric region; and depositing a gate layer on the at least one dielectric layer, over the second geometric region and over at least a portion of the second geometric region that is adjacent the alternating first and second conductivity type regions.

21. The method of claim 20 wherein providing a substrate layer on a dielectric comprises providing a substrate layer on a buried oxide.

22. The method of claim 20 wherein forming within the substrate layer a first geometric region comprising alternating regions of first and second conductivity types comprises forming within the substrate layer a first geometric region comprising alternating and abutting regions of first and second conductivity types.

23. The method of claim 20 wherein forming within the substrate layer a first geometric region comprising alternating regions of first and second conductivity types comprises forming within the substrate layer a first geometric region comprising alternating regions of first and second conductivity types separated by STI regions.

24. The method of claim 20 wherein forming within the substrate layer a first geometric region comprising alternating regions of first and second conductivity types comprises forming within the substrate layer a first geometric region comprising alternating regions of first and second conductivity types separated by polysilicon regions.

25. The method of claim 20 wherein depositing at least one dielectric layer on at least the second geometric region comprises depositing at least one dielectric layer on at least the second geometric region that is thicker in at least one portion of the second geometric region than in another portion of the second geometric region.

26. The method of claim 20 further comprising forming an ESD protection device from the ESD structure.

27. The method of claim 26 wherein forming an ESD protection device comprises forming an ESD protection device having at least one DTMOS device.

* * * * *

UNITED STATES PATENT AND TRADEMARK OFFICE
CERTIFICATE OF CORRECTION

PATENT NO. : 6,118,155
DATED : September 12, 2000
INVENTOR(S) : Steven H. Voldman It is certified that error appears in the above-identified patent and that said Letters Patent is hereby corrected as shown below:

In column 4, line 61, after "region" delete "100" and substitute therefor -- 110 --.

Signed and Sealed this

Twenty-fourth Day of April, 2001

Attest:

NICHOLAS P. GODICI

Attesting Officer

Acting Director of the United States Patent and Trademark Office